United States Patent
Lee et al.

(10) Patent No.: US 8,120,977 B2
(45) Date of Patent: Feb. 21, 2012

(54) TEST METHOD FOR NONVOLATILE MEMORY DEVICE

(75) Inventors: Wan Seob Lee, Gangwon-Do (KR); Jin Yong Seong, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 387 days.

(21) Appl. No.: 12/362,441

(22) Filed: Jan. 29, 2009

(65) Prior Publication Data

US 2009/0287972 A1    Nov. 19, 2009

(30) Foreign Application Priority Data

May 13, 2008    (KR) .................. 10-2008-0044125

(51) Int. Cl.
*G11C 29/00*    (2006.01)
(52) U.S. Cl. ............... 365/201; 365/189.05; 365/230.06
(58) Field of Classification Search .............. 365/201, 365/189.05, 230.06, 189.08, 163, 148, 189.01, 365/189.07, 233.1, 191, 194, 233.5, 219, 365/220, 221
See application file for complete search history.

(56) References Cited

U.S. PATENT DOCUMENTS

| | | | |
|---|---|---|---|
| 4,799,198 A | 1/1989 | Ogawa | |
| 2005/0063230 A1* | 3/2005 | Seitoh | ........................... 365/201 |
| 2008/0239865 A1* | 10/2008 | Takemura et al. | ......... 365/233.1 |
| 2009/0116300 A1* | 5/2009 | Ha | ................................ 365/201 |

FOREIGN PATENT DOCUMENTS

| KR | 1020010041215 A | 5/2001 |
|---|---|---|
| KR | 1020080080295 A | 9/2008 |

OTHER PUBLICATIONS

Notice of Allowance issued from Korean Intellectual Property Office on Jan. 28, 2010.

* cited by examiner

*Primary Examiner* — Dang Nguyen
(74) *Attorney, Agent, or Firm* — IP & T Group LLP

(57) ABSTRACT

A test method for nonvolatile memory devices where, in one aspect of the method, a specific operation mode is selected according to a signal input through a single I/O pin in a period in which a write enable signal is inactivated. The write enable signal or a read enable signal is activated according to the selected operation mode. A plurality of signals is input through the single I/O pin in a period in which the write enable signal is activated. The plurality of signals is output through the single I/O pin in a period in which the read enable signal is activated.

13 Claims, 3 Drawing Sheets

500

TEST METHOD FOR NONVOLATILE MEMORY DEVICE

CROSS-REFERENCE TO RELATED APPLICATION

The present application claims priority from Korean patent application number 2008-0044125, filed on May 13, 2008, which is incorporated by reference in its entirety.

BACKGROUND OF THE INVENTION

The present invention relates to a test method for nonvolatile memory devices.

In recent years, there has been an increasing demand for nonvolatile memory devices that can be electrically programmed and erased and do not need the refresh function of rewriting data at specific intervals.

The nonvolatile memory cell is an element enabling electrical program/erase operations and is configured to perform the program and erase operations by changing its threshold voltage as electrons are migrated by a strong electric field applied to a thin oxide layer.

A fabrication process of the nonvolatile memory device includes a test process for completed products. In particular, there has been known a multi-chip test method, which can reduce the test time and perform tests for several chips at the same time. In this multi-chip test method, it is necessary to minimize the test time.

BRIEF SUMMARY OF THE INVENTION

The present invention is directed towards a test method for nonvolatile memory devices, which enables a test for chips even through connection of a single I/O pin by inputting signals, which are input through the single I/O pin, as a control signal and data separately.

A test method for nonvolatile memory devices according to an aspect of the present invention includes selecting a specific operation mode according to a signal input through a single I/O pin in a period in which a write enable signal is inactivated, activating the write enable signal or a read enable signal according to the selected operation mode, inputting a plurality of signals through the single I/O pin in a period in which the write enable signal is activated, and outputting the plurality of signals through the single I/O pin in a period in which the read enable signal is activated.

A test method for nonvolatile memory devices according to another aspect of the present invention includes selecting a specific operation mode according to a signal input through a single I/O pin in a period in which a first control signal is inactivated, activating the first control signal according to the selected operation mode, and inputting a plurality of signals through the single I/O pin in a period in which the first control signal is activated.

A test method for nonvolatile memory devices according to further another aspect of the present invention includes selecting a specific operation mode according to a signal input through a single I/O pin in a period in which a first control signal is inactivated, activating a second control signal according to the selected operation mode, and outputting a plurality of signals through the single I/O pin in a period in which the second control signal is activated.

DESCRIPTION OF SPECIFIC EMBODIMENTS

Now, a specific embodiment according to the present invention will be described with reference to the accompanying drawings. However, the present invention is not limited to the disclosed embodiment, but may be implemented in various ways. The embodiment is provided to complete the disclosure of the present invention and to allow those having ordinary skill in the art to understand the scope of the present invention. The present invention is defined by the category of the claims.

Figure 1:
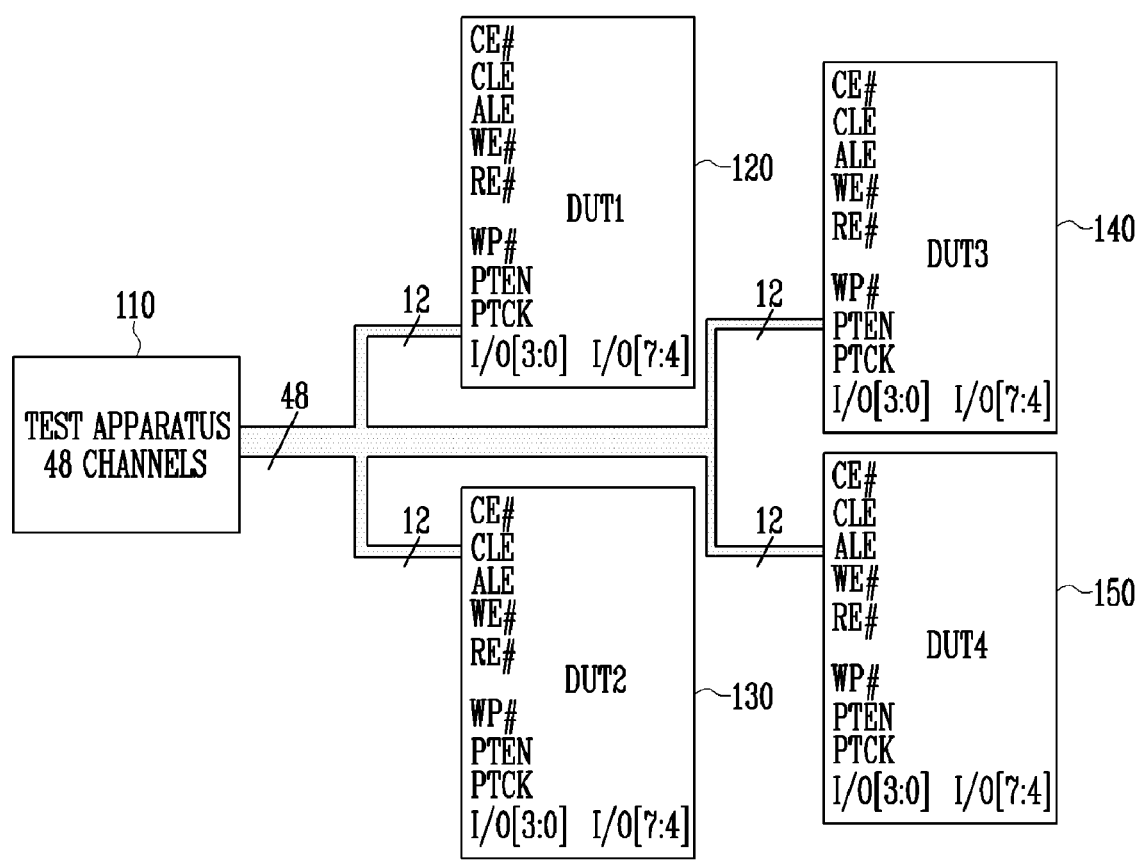
FIG. 1 is a diagram showing a typical test method of a nonvolatile memory device.

FIG. 1 is a diagram showing a typical test method of a nonvolatile memory device.

In a test method, it is determined whether a nonvolatile memory device, being in a wafer level, has been properly fabricated. In FIG. 1, it is shown that a single test apparatus tests several devices under test (DUTs) at the same time. This is called a multi-chip test. Typically, a data I/O mode is divided into ×8 or ×16 mode. The number of I/O pins of a memory chip can be 8 or 16. Here, in order to use a minimum channel, the apparatus does not test all the I/O pins (I/O [7:0]) of a nonvolatile memory device at the same time, but tests all the I/Os by dividing them into every two pins so that a great number of DUTs can be tested at the same time.

That is, assuming that the channel number of the test apparatus is 48 and four chips can be tested at the same time, 12 channels can be allocated to each chip. Meanwhile, each chip is input a total of eight different control signals other than I/Os. When considering this, a total number of channels, which can be allocated to the I/O pins, is four.

Now, in order to test eight I/O pins through the four channels, two read operations are typically undergone. The test process is described below in more detail.

Figure 2:
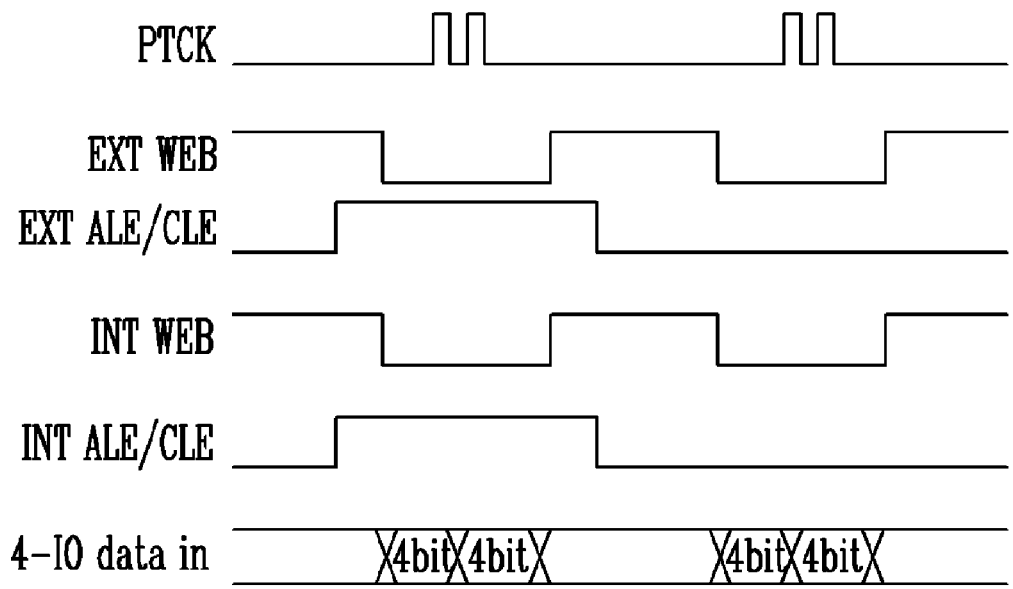
FIG. 2 shows waveforms illustrating various pulses, which are applied in a typical test process of the nonvolatile memory device.

FIG. 2 shows waveforms illustrating various pulses, which are applied in a typical test process of the nonvolatile memory device.

The test process is a process of testing data inputs through the I/O pins.

When a variety of external control signals EXT WEB, EXT ALE/CLE are applied through the test apparatus 110, the signals are transferred to each of chips 120 to 150 and function as internal control signals INT WEB, INT ALE/CLE.

In a period in which an address latch enable signal ALE or a command latch enable signal CLE is activated and a write enable signal WEB is activated, 4-bit data is input through the I/O pins in synchronization with a clock signal PTCK. That is, 4-bit data is input every clock signal PTCK. When the input data is an address, the address latch enable signal ALE is activated and, when the input data is a command, the command latch enable signal CLE is activated.

As described above, in the typical test process, several channels are required for each control signal and data inputs through the I/O pins.

Figure 3:
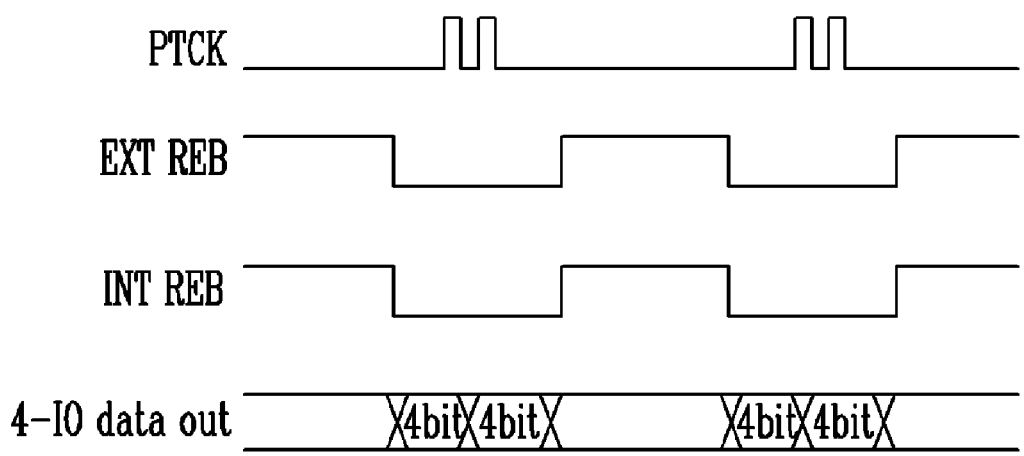
FIG. 3 shows waveforms illustrating various pulses, which are applied in the typical test process of the nonvolatile memory device.

FIG. 3 shows waveforms illustrating various pulses, which are applied in the typical test process of the nonvolatile memory device.

The test process is a process of testing data outputs through the I/O pins.

First, when an external control signal EXT REB is applied through the test apparatus 110, the control signal is transferred to each of the chips 120 to 150 and functions as an internal control signal INT REB.

In a period in which a read enable signal REB is activated, 4-bit data is output through the I/O pins in synchronization with a clock signal PTCK. That is, 4-bit data is output every clock signal PTCK. As described above, in the typical test process, several channels are required for each control signal and data outputs through the I/O pins.

Figure 4:
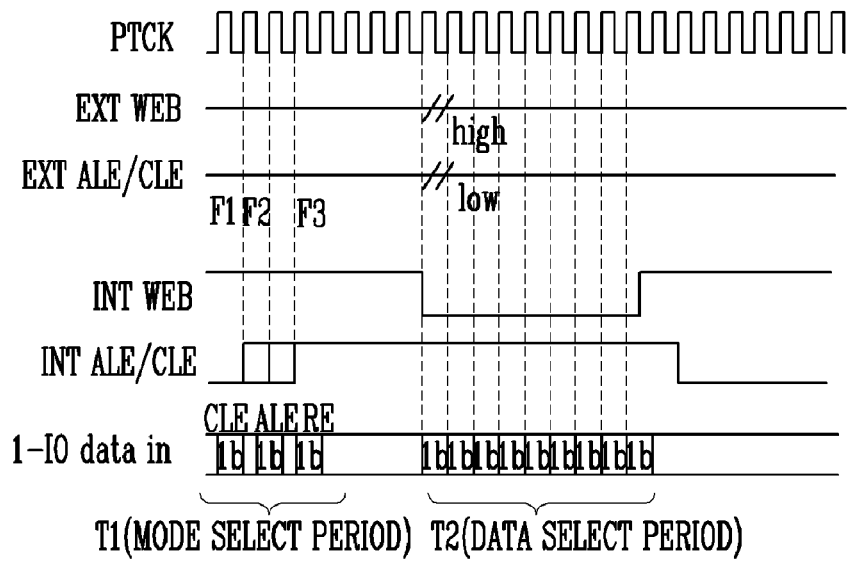
FIG. 4 shows waveforms illustrating various pulses, which are applied in a data input test process of a nonvolatile memory device in accordance with an embodiment of the present invention.
Figure 5:
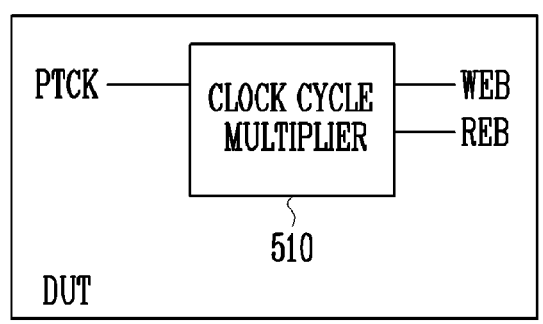
FIG. 5 is a block diagram showing a clock cycle multiplier applicable to the present invention.

FIG. 4 shows waveforms illustrating various pulses, which are applied in a data input test process of a nonvolatile memory device in accordance with an embodiment of the present invention. FIG. 5 is a block diagram showing a clock cycle multiplier applicable to the present invention.

In the present invention, a signal input through one I/O pin functions both as a control signal and as data. That is, a signal input through the I/O pin is considered as the control signal in one period, and a signal input through the I/O pin is considered as the data in another period. Meanwhile, since the control signal and the data are input through one I/O pin, the number of chips that can be tested at the same time increases significantly when compared with the prior art. For example, 12 channels are required in the prior art as in the case of FIG. 1. However, in the present invention, 12 times more chips can be tested at the same time than in the prior art, since a test is possible through only one channel. A detailed construction of the present invention is described below.

A clock pulse PTCK used in a test process is a reference clock supplied from the test apparatus 110. The clock pulse PTCK is continuously applied, unlike in a typical method. In accordance with an embodiment of the present invention, the additional external control signals EXT WEB, EXT ALE/CLE are not received, but instead a signal input through the I/O pin functions as a control signal. Referring to FIG. 5, a clock cycle multiplier 510 included in each chip multiplies the cycle of the clock pulse PTCK and is then used as a write enable signal WEB and a read enable signal REB. Meanwhile, the clock cycle multiplier 510 can be implemented using a counter circuit included in each DUT.

A method of distinguishing a control signal and data through one I/O pin is now described. First, the write enable signal WEB generated through the clock cycle multiplier 510 is activated during a specific period T2. It is determined whether a signal input to the I/O pin will function as the control signals ALE, CLE, RE or data based on whether the write enable signal WEB has been activated.

In other words, a period T1 in which the write enable signal WEB is inactivated is set to a mode select period. In the mode select period, each control signal is distinguished according to a time point at which a signal of a high level is input through the I/O pin.

When a signal of a high level is input through the I/O pin at a first toggling time point F1 of the clock pulse as shown in FIG. 4, the input signal is determined as a command input mode CLE. Thereafter, data input through the I/O pin in a period in which the write enable signal WEB is activated is determined as a command signal.

When a signal of a high level is input through the I/O pin at a second toggling time point F2 of the clock pulse, the input signal is determined as an address input mode ALE. Thereafter, data input through the I/O pin in a period in which the write enable signal WEB is activated is determined as an address signal.

When a signal of a high level is input through the I/O pin at a third toggling time point F3 of the clock pulse, the input signal is determined as a read enable switching mode RE and, therefore, the write enable signal WEB switches to the read enable signal REB. The read enable signal REB is activated according to the switching operation, which is described later on with reference to FIG. 6. Meanwhile, the write enable signal WEB and the read enable signal REB are not activated at the same time.

If there is no signal of a high level, which is input through the I/O pin in a period in which the write enable signal WEB is inactivated, it is determined as a general data input signal WE and data, which is subsequently input through the I/O pin in a period in which the write enable signal WEB is activated, is determined as general data.

Meanwhile, in each data input period T2, a signal input through the I/O pin is input as data in synchronization with a rising edge of each clock pulse. In this case, the write enable signal WEB should be activated during at least eight cycles.

Figure 6:
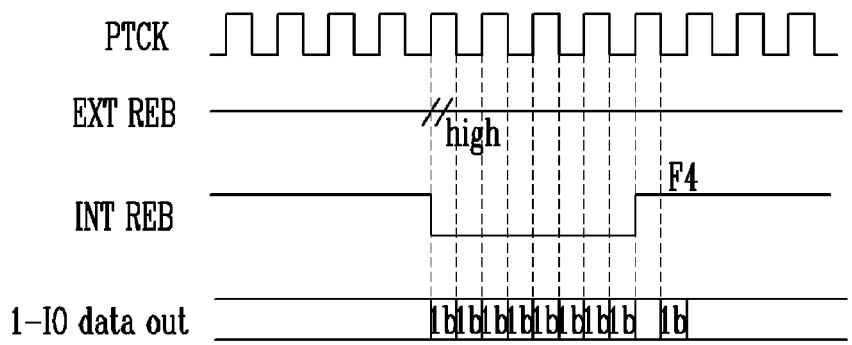
FIG. 6 shows waveforms illustrating various pulses, which are applied in a data output test process of a nonvolatile memory device in accordance with an embodiment of the present invention.

FIG. 6 shows waveforms illustrating various pulses, which are applied in a data output test process of a nonvolatile memory device in accordance with an embodiment of the present invention.

This drawing shows that, in the case in which a signal of a high level is input through the I/O pin at a third toggling time point F3, the write enable signal WEB switches to the read enable signal REB.

As the read enable signal REB is activated, data stored in a memory chip is sequentially output through one I/O pin. Meanwhile, when data is out, the data is output in synchronization with a time point at which the level of the clock pulse PTCK shifts, that is, a rising edge and a falling edge. The read enable signal REB has to be activated during at least four cycles.

Meanwhile, when a signal of a high level is applied through the I/O pin at a fourth toggling time point F4 of the clock pulse after the read enable signal REB is inactivated, the high-level signal is determined as a read operation sustain signal and, therefore, the read operation execution mode keeps remained. However, when a signal of a low level is applied through the I/O pin at the fourth toggling time point F4, the read enable signal REB switches to the write enable signal WEB and the above operation of FIG. 4 is executed.

As described above, an operation mode is determined and data is also input based on the state of the write enable signal WEB or the read enable signal REB, which is generated by multiplying the cycle of the clock pulse, and the level of data input through one I/O pin. Accordingly, the number of chips, which can be tested at the same time, can be increased significantly.

Meanwhile, it has been described that the number of data input through the I/O pin is 8. It is however evident to those skilled in the art that the number of data input through the I/O pin may be changed. That is, the present invention can be applied to a chip of ×16 mode. In this case, 16 data are sequentially input or output in a data input period or output period.

In accordance with the above construction of the present invention, a control signal and data can be distinguished based on only a signal input through a single I/O pin, so that I/O tests can be performed. Accordingly, the number of memory chips, which is significantly larger than that of the prior art, can be tested at the same time.

The embodiment disclosed herein has been proposed to allow a person skilled in the art to easily implement the present invention, and the person skilled in the part may implement the present invention in various ways. Therefore, the scope of the present invention is not limited by or to the embodiment as described above, and should be construed to be defined only by the appended claims and their equivalents.

What is claimed is:

1. A test method for nonvolatile memory devices, the method comprising:
    selecting a specific operation mode among a command input mode, an address input mode, a read operation mode, or a write enable mode according to a signal inputted through an I/O pin of a plurality of I/O pins in a period in which a write enable signal that is generated in response to a reference clock supplied in a test mode is inactivated, wherein the command input mode is selected when a signal of a first level is inputted through the I/O pin at a first toggling time point of the clock, the address input mode is selected when the signal of the first level is inputted through the I/O pin at a second toggling time point of the clock, the read operation mode is selected when the signal of the first level is inputted through the I/O pin at a third toggling time point of the clock, and the write enable mode is selected when the I/O pin is sustained at a second level in a period in which the write enable signal is inactivated;
    activating the write enable signal or a read enable signal according to the selected operation mode;
    inputting a command signal, an address signal, or test data in the nonvolatile memory device through the I/O pin in a period in which the write enable signal is activated; and
    outputting the test data to a test device through the I/O pin in a period in which the read enable signal is activated.

2. The test method of claim 1, wherein, when the command input mode, the address input mode or the write enable mode is selected, the write enable signal is activated and the command signal, the address signal, or the test data are inputted through the I/O pin.

3. The test method of claim 1, wherein, when the read operation mode is selected, the read enable signal is activated and the test data are outputted through the I/O pin.

4. The test method of claim 2, wherein, when the command input mode is selected, the write enable signal is activated and the command signal is inputted through the I/O pin.

5. The test method of claim 2, wherein, when the address input mode is selected, the write enable signal is activated and the address signal is inputted through the I/O pin.

6. The test method of claim 1, further comprising, when the signal of the first level is inputted through the I/O pin at a fourth toggling time point of the clock after the activation period of the read enable signal is finished, selecting a read operation sustain mode.

7. A test method for nonvolatile memory devices, the method comprising:
    generating a write enable signal and a read enable signal according to a reference clock supplied in a test mode;
    receiving data as a command latch enable signal, an address latch enable signal, and a read enable switching signal for switching the write enable signal to the read enable signal through an I/O pin of a plurality of I/O pins in a period in which the write enable signal is at a first level;
    receiving command data, address data, and test data through the I/O pin in a period in which the write enable signal is at a second level according to the received data;
    inputting the test data in the nonvolatile memory device through the I/O pin according to the received address data after the command data and the address data are received; and
    outputting the test data to a test device through the I/O pin in a period in which the read enable signal is at the second level when the write enable signal is switched to the read enable signal according to the read enable switching signal.

8. The test method of claim 7, wherein receiving the data as the command latch enable signal, the address latch enable signal, and the read enable switching signal comprises:
    receiving data as the command latch enable signal at a first toggling time point of the clock through the I/O pin;
    receiving data as the address latch enable signal at a second toggling time point of the clock through the I/O pin; and
    receiving data as the read enable switching signal at a third toggling time point of the clock through the I/O pin.

9. The test method of claim 7, wherein the write enable signal is generated by multiplying a period of the clock.

10. The test method of claim 8, wherein when data of a first level is received through the I/O pin at the third toggling time point of the clock, the write enable signal is switched to the read enable signal.

11. The test method of claim 8, wherein when data of a second level is received through the I/O pin at the third toggling time point of the clock, a level of the write enable signal is maintained.

12. The test method of claim 8, wherein when data of a first level is received through the I/O pin at a toggling time point of the clock after a period that the read enable signal is at the second level is finished, a level of the read enable signal is maintained.

13. The test method of claim 8, wherein when data of a second level is received through the I/O pin at a toggling time point of the clock after a period that the read enable signal is at the second level is finished, the read enable signal is switched to the write enable signal.

* * * * *